United States Patent [19]

Crowther et al.

[11] 3,949,191

[45] Apr. 6, 1976

[54] DATA STORAGE AND RETRIEVAL SYSTEM

[75] Inventors: Ted J. Crowther, Saratoga; Charles F. Jacobson, Cupertino; Kent K. Sutherlin, Mountain View, all of Calif.

[73] Assignee: Optical Data Systems, Inc., Mountain View, Calif.

[22] Filed: July 10, 1974

[21] Appl. No.: 487,346

Related U.S. Application Data

[62] Division of Ser. No. 254,589, May 18, 1972, Pat. No. 3,849,766.

[52] U.S. Cl. ............... 235/61.7 B; 235/61.11 E; 340/173 LM; 350/3.5; 250/568; 235/61.12 N
[51] Int. Cl.² G06K 7/10; G11B 7/00; G01N 21/30; G06K 19/06
[58] Field of Search . 235/61.7 B, 61.11 E, 61.11 D, 235/61.7 R; 340/173 LM, 146.3 P, 173 LT, 173 R, 149 A; 200/46; 250/568, 569, 570; 194/4; 95/4.5; 350/3.5

[56] References Cited
UNITED STATES PATENTS

| | | | |
|---|---|---|---|
| 3,039,582 | 6/1962 | Simjian | 194/4 |
| 3,216,317 | 11/1965 | Nail | 235/61.11 E |
| 3,344,258 | 9/1967 | Michels | 235/61.7 B |
| 3,610,889 | 6/1966 | Goldman | 235/61.7 B |
| 3,643,216 | 2/1972 | Greenaway | 340/146.3 P |
| 3,715,733 | 2/1973 | Feiner | 340/173 LM |
| 3,716,286 | 2/1973 | St. John | 350/3.5 |
| 3,737,878 | 6/1973 | Gamblin | 340/173 LM |
| 3,740,530 | 6/1973 | Hoffer | 235/61.7 B |
| 3,814,904 | 6/1974 | Russell | 235/61.11 E |

*Primary Examiner*—Daryl W. Cook
*Assistant Examiner*—Robert M. Kilgore
*Attorney, Agent, or Firm*—Townsend and Townsend

[57] ABSTRACT

Data is recorded in holographic form on elongate film strips in a plurality of parallel, longitudinally extending hologram rows. The film is longitudinally moved past a light beam to reconstruct holographic patterns which are then sensed. The light beam is perpendicular to the film and movable transversely to the film so that any holograph row can be illuminated. The recorded holograms in a row can be searched for comparison with a reference number or symbol for credit card verification and the like in which a small subgroup of members, such as those who forfeited their credit, are to be identified. The reference numbers of the members of the subgroup are recorded on the film and a given member, that is the reference number of a given customer, is compared with the recorded holograms. The reference number of each member of the group is assigned to a particular row so that his number will appear in one and only one row of holograms on the film. Consequently, only one row needs to be scanned to determine the presence or absence of the given member in the subgroup.

28 Claims, 8 Drawing Figures

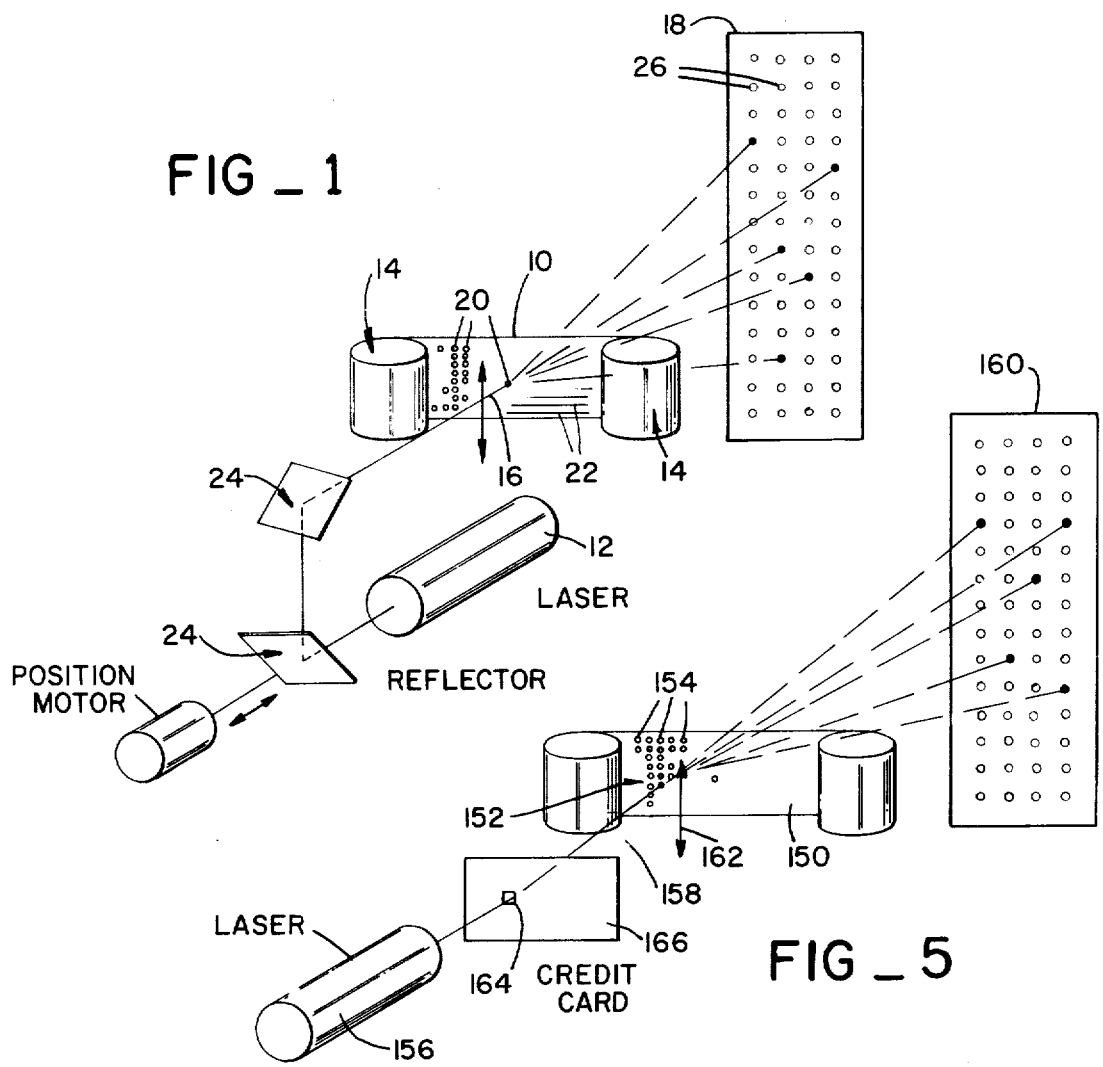
FIG_1
FIG_5
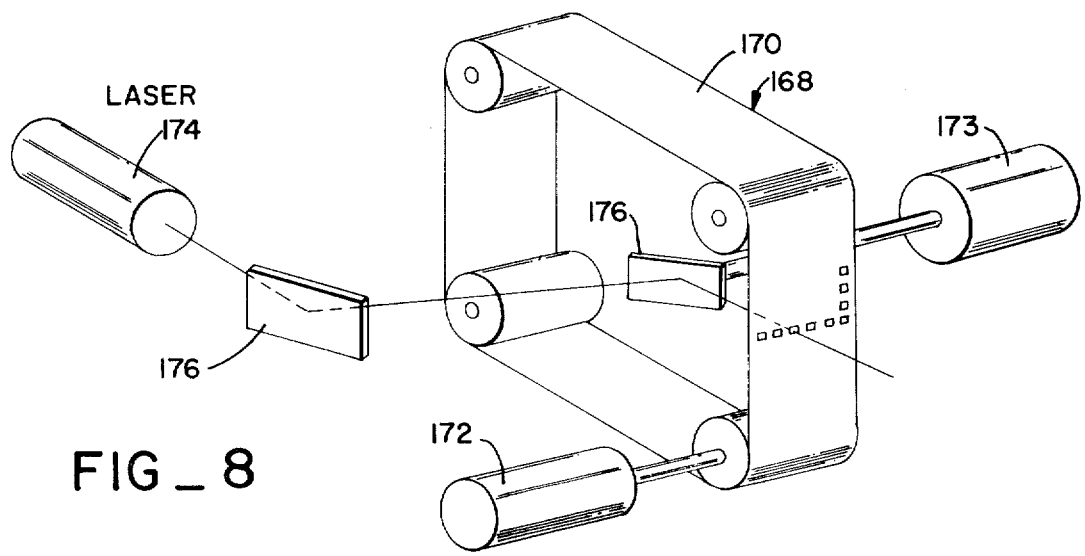
FIG_8

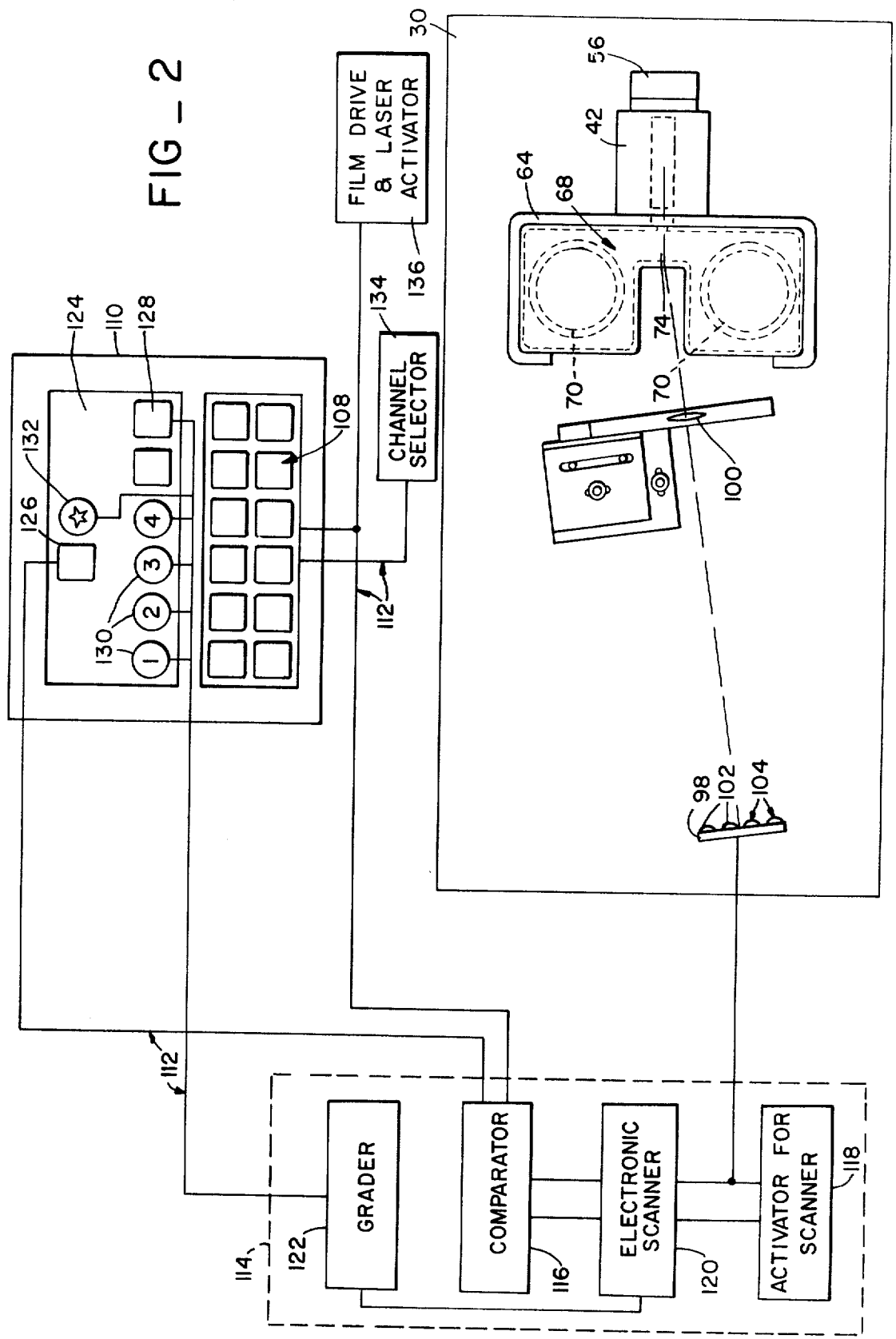
FIG_2

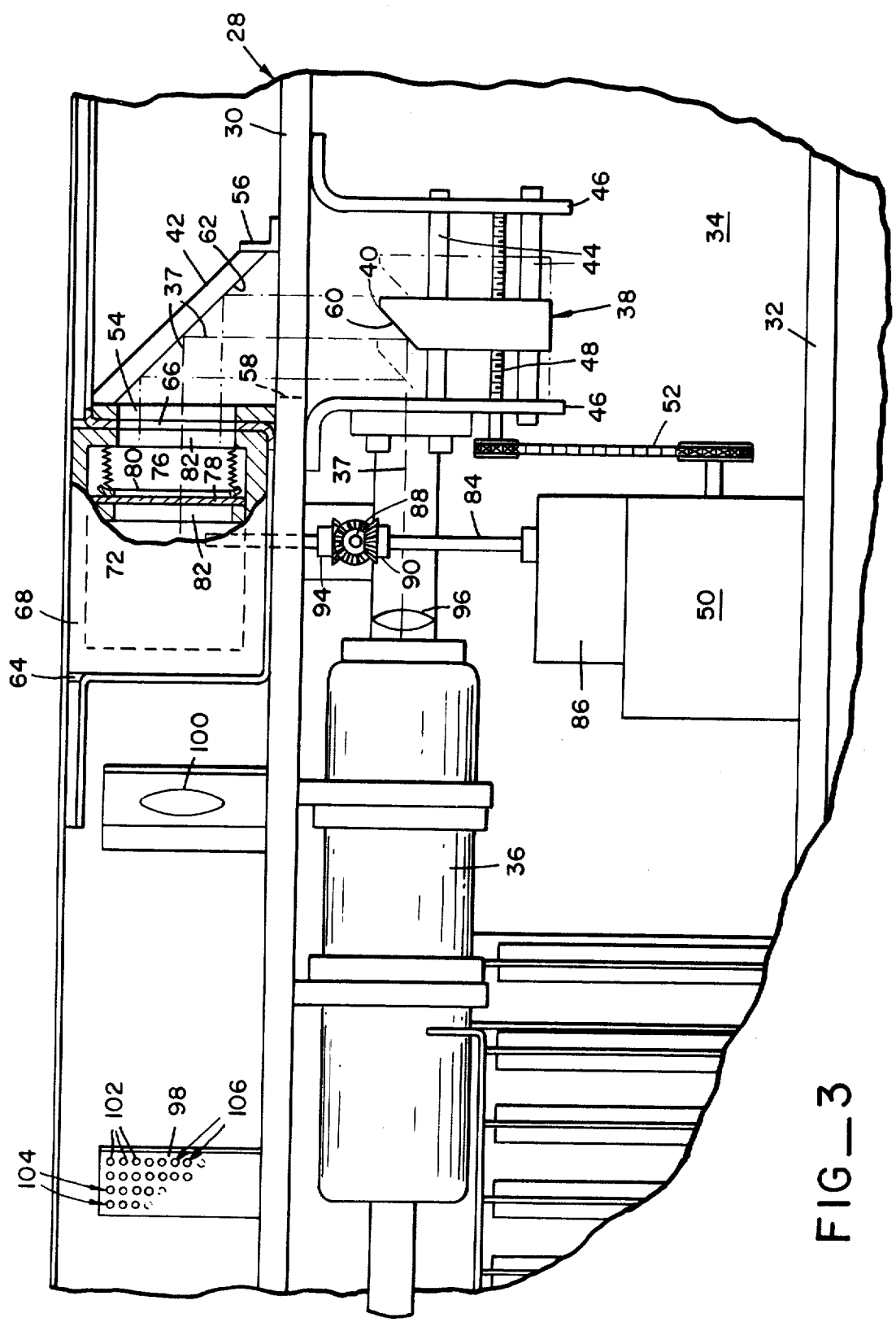
FIG_3

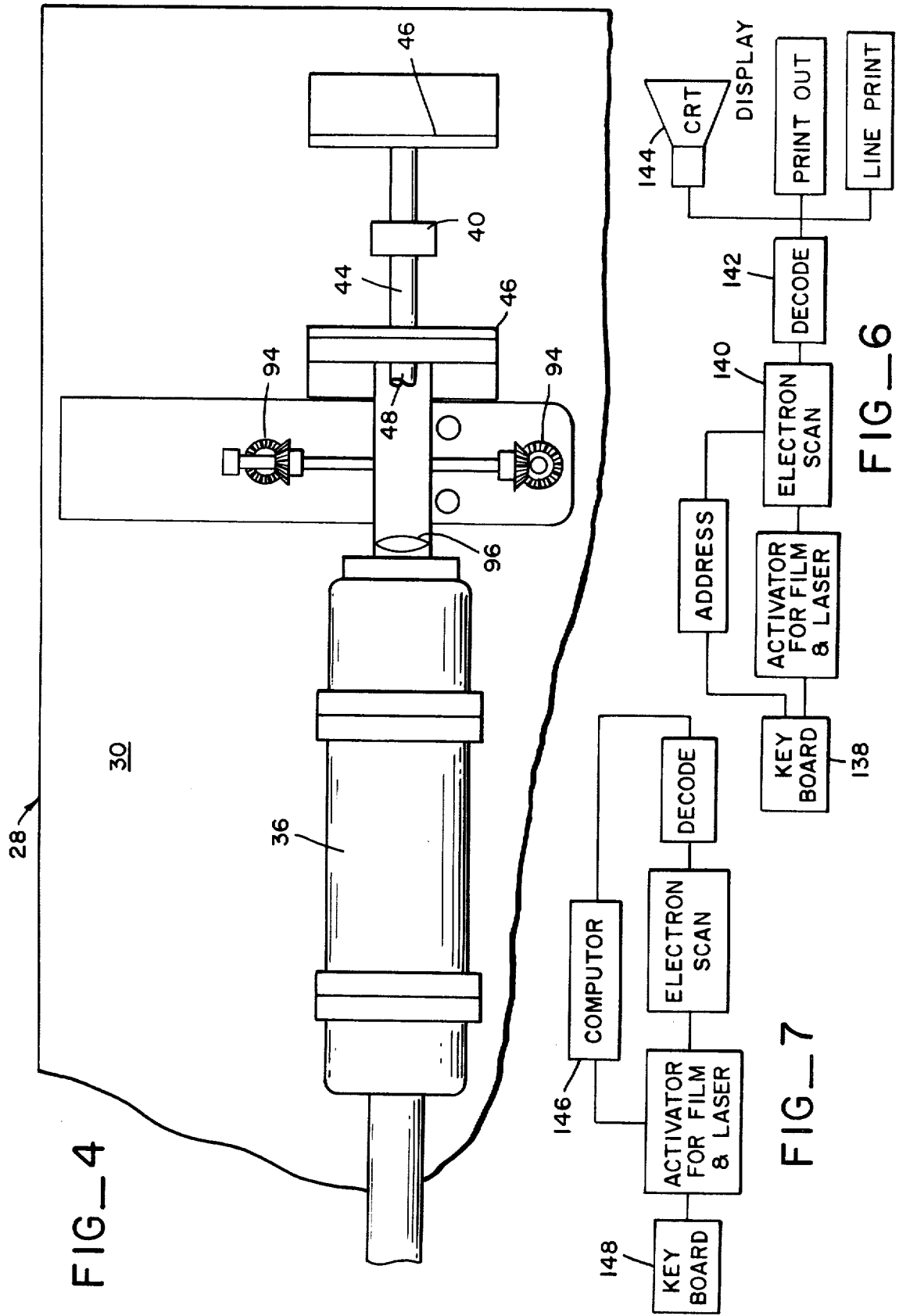

DATA STORAGE AND RETRIEVAL SYSTEM

This is a division of application Ser. No. 254,589, filed May 18, 1972, now U.S. Pat. No. 3,849,766.

BACKGROUND OF THE INVENTION

Recently, it has been suggested to employ holographic data storage and retrieval systems for replacement of or complementary to existing systems employing magnetic tape or discs, punched cards or tape, etc. In particular, it has been suggested to holographically record information on photographic plates which are addressed by deflecting a light beam to a particular space on the plate with another hologram or by moving the plate on an X-Y table to align it with the light beam.

Such systems, though workable, have drawbacks. A large volume of data to be stored requires large photographic plates which can be too bulky for some applications. In addition, where holographic beam deflection is employed, a substantial portion of the overall photographic plate area might be unused if, for one reason or another, no information is to be recorded at a particular address. Lastly, the X-Y positioning of photographic plates is relatively expensive due to the intricate mechanism necessary to effect planar movements of the plate. Thus, though proposed in the past, such prior art systems have never matured into a commercially feasible product.

Even with the proliferation of data storage and retrieval systems experienced during the last several years, no significant progress has been made in instances where the same data must be retrieved at many different, widely spaced apart locations. This is most commonly encountered in commercial credit verification systems, for credit checks of customers in a department store, a chain store, the retail outlets of a major oil company or at places where one of the national or worldwide credit card systems is accepted. In all instances there are hundreds of thousands to millions of credit holders, only a small proportion of which represent bad credit risks. In the past the credit issuing store, firm or organization (hereinafter "creditor") periodically provided a list of invalid or stolen credit cards which were used at the point of sale for checking customers' credit. In large credit card systems such lists are frequently not used by sales personnel because it is too time consuming to search the list each time a sale is made.

Attempts have also been made to increase the efficiency of verifying credit standing with on-line computer systems in which a central computer could be addressed by the sales personnel by telephone or otherwise. Such systems provide access to constantly updated credit information. However, even these credit checks are time consuming, frequently involve costly long-distance calls that are sometimes hard to complete and require high-priced computers. Thus, such systems are too expensive to warrant widespread use and they have not become generally accepted.

More recently it has been suggested to employ holographic data storage and retrieval systems as particularly well suited for credit verification systems. In such systems an independent holographic data storage and retrieval unit is placed at the point of sale for checking the credit of all customer's to whom credit is to be extended to determine whether a particular customer's credit was revoked or if the customer attempts to perpetrate fraud by claiming the credit of another as is commonly done by using stolen credit cards. Such holographic systems were to employ the already described holographic memories. The holographic memories are ideally suited for this purpose because they are inexpensive to update and to distribute by mail. Moreover, the memories are permanent and indelible.

Nevertheless, the practical implementation of the holographic systems was not up to par with their conceptual usefulness. Consequently, the suggestions remained just that and never materialized into a useful form. Thus, large verification systems such as credit checks continue to employ cumbersome, out-dated and largely ineffective methods.

SUMMARY OF THE INVENTION

The present invention provides an effective, high speed and relatively inexpensive verification system for use in making credit checks, identifying persons, permitting access to restricted areas, authenticating airline tickets and the like. Generally, the present invention permits the determination of whether or not the holder of an identifying or authorizing instrument such as a credit card, an identity card, a ticket or the like is entitled to what the instrument appears to entitle him. In this manner, the present invention enables one to verify the card holder's credit and/or any limits thereon, whether he is authorized to use a given card, whether a ticket being handed over has been lost or stolen, etc.

In the verification system of the present invention a check is made by comparing an identifying symbol, mark, description or number, hereinafter sometimes collectively referred to as "reference number", with a memory of certain of such numbers. Numbers which represent abnormal conditions, such as bad credit, a stolen card, or also impeccible credit requiring preferred attention, are recorded on the memory. When a check is to be made the reference number of the card holder is compared with the numbers in the memory to determine whether or not the reference number matches a recorded number. The absence of the match indicates that no abnormal condition exists and that the customary credit or service can be extended to the card holder, or that he may be admitted to a given area. If a match is found the operator is advised that an abnormal condition exists. The operator may be advised that credit or access is to be refused to the card holder, that credit is to be limited to a stated maximum, that the card holder is unauthorized to use the card, that preferential treatment is to be given to him, etc.

A self-contained, relatively inexpensive and readily updated apparatus is provided which is placed at each check point and addressed each time the operator is about to extend credit, permit access or the like. Thus, before the operator actually extends the credit or permits the access, he determines whether or not this is properly done. Today's huge credit card fraud losses, bad debt losses and the like can thus be significantly reduced and for practical purposes largely eliminated. This in turn enables the creditor to readjust its credit granting procedures and to extend credit to persons who have heretofore been denied credit because under established criteria they involve too high a risk. With the constant check on the use of the card holder's credit and his timely payment the creditor can issue credit so long as the card holder complies with his obligations. If he fails, his number is entered in the memory and no further credit will be extended to him. In this manner the creditor can significantly increase its sales and profits while reducing its bad debts.

In its broader aspects the present invention contemplates recording a multiplicity of holograms in a plurality of longitudinal rows on a strip of photographic film such as a length of 35 millimeter film. The film strip is moved parallel to the rows past a read station and light, preferably laser light, is directed at a particular row to reconstruct images from the holograms. The images are then serially sensed.

The holograms are preferably of the Fourier transform type which exhibit the unusual property of "shift invariance". "Shift invariance" means that images, say a binary spot pattern focused on a detector remains fixed independently of the position of the beam and of the film. Thus, beam or hologram misalignments still result in a properly aligned image on the detector. Furthermore, since all parts of the hologram contain all of the information that is stored the reconstructed image is an image of the entire hologram, say the entire binary spot pattern even if only a part of the hologram coincides with the laser light. Consequently, manufacturing tolerances can be relaxed resulting in a more economical device.

The credit of a customer, or generally a person's status within a system, is verified in accordance with the invention as follows. The presence or absence of the customer, who is a member of a larger group, say of all the credit card holders of a major oil company, in a smaller subgroup, namely those members whose credit is bad or limited or who should receive special attention due to some preference to be accorded them, is signalled to the operator. To this end, each member has an assigned reference number, the standard credit card number for example, and all members are assigned to a number of member classes in a preferably random manner. Those members who are both members of the subgroup, e.g., the bad credit risks, and whose reference number is assigned to a particular class are recorded in holographic form on the film strip in a given longitudinal row of the film. The numbers of those bad credit members assigned to a different class have holograms of their reference number recorded in another, parallel longitudinal row of the film so that the finished recorded film has a number of rows which equals the number of classes to which all members of the group are assigned. Consequently, to check the holographic record, that is the film, for the presence or absence of the reference number of any given card holder within the system only the row in which his reference number would be recorded needs to be checked. This substantially reduces the number of holograms that must be scanned and greatly increases the speed with which the memory can be searched. This makes the invention ideally suited for point-of-sale credit verification, identity checks, checking tickets, etc.

In performing the check some of the digits of the reference number are employed to position the laser so that the laser beam is directed to the proper hologram row on the film. The film is then moved past the laser and forms an image of the hologram on a detector. As the beam is directed to a hologram, the image reconstructed from the hologram on the detector is "switched on" and remains stationary even while the film continues to move. Thus, there is no need for conventional stop and go motion as is the case with conventional photographic readers. In the present invention the images reconstructed from holograms remain stationary on the detector for a sufficient length of time to permit its detection and sensing.

The detector itself comprises an array of photosensitive cells which are electronically scanned each time an image appears on the detector. To avoid the need for synchronization between the film drive and the electronic detector scan the detector senses when an image appears and in response thereto initiates the electron scan.

In a preferred embodiment, the photosensitive cells are arranged in columns and a number of rows at least equal to the number of digits in the reference number. There are preferably additional rows in the detector and the holograms on the film include additional information which relates to the credit rating, maximum credit limits, a request for preferential treatment, etc.

The output signal from the electronic detector scan is compared with a reference signal produced from the reference number. The reference number is preferably punched into a keyboard to generate a binary reference signal compatible with the output from the detector scan and the two are compared and searched for a match. If no match is found, the operator is advised that the card holder does not belong to the subgroup which means his credit is good or no preferential treatment is needed. If a match is found, additional cells on the detector are used to advise the operator of the status of the submitted credit card. Thus, the operator might be advised that no credit should be extended to the customer, that his credit should be limited to a predetermined amount, that the submitted credit card is a stolen or lost card or that the customer should receive preferential treatment.

In terms of specific apparatus, the present invention provides a self-contained, small and portable memory unit in which the above-described film memory is inserted. Briefly, the unit comprises a housing that covers a support structure, means for moving the film longitudinally past a read station and a light source mounted to the support structure. Mirror means is obliquely positioned and linearly movable with respect to the light source for adjusting the position of the beam in a direction perpendicular to the film movement while maintaining the beam parallel in all its operative positions.

The keyboard and means for signalling the operator, such as a plurality of indicator lights, are mounted in a separate small, portable keyboard unit. The remainder of the apparatus including the electronic logic briefly described earlier are mounted in the memory unit with electric cable means between the two for the necessary signal transmission between them. Thus, the keyboard can be conveniently located at a cash register, checking point or counter. The portability of the device lends it for use at different locations as for example at checkout points during warehouse sales, sidewalk sales, etc. where all installations are temporary and only electric power is available where, however, credit checks are as important as at permanent cash register locations on the sales floor.

To minimize costs a relatively expensive memory unit can be multiplexed, that is, it can simultaneously serve a plurality of relatively inexpensive keyboard units. Operation of a multiplexed memory unit is as described above except that the unit includes means for blocking the memory against addressing while it processes an address received from one of the keyboard units. As soon as the operation is completed the memory unit is ready for addressing by another keyboard. The advantages of the present invention can thus be enjoyed with a relatively small capital expenditure.

For use of the memory and keyboard units on sales floors the keyboard unit can be constructed with a printer which imprints the account or credit card number on an invoice. This serves as a verification that the credit check has been made and reduces the time to complete a transaction since the heretofore common separate imprinting operation for the invoice is no longer necessary.

The holographic memory is readily and inexpensively updated by recording a newly revised list of bad credit cards on a length of film. The existing film memory is then simply replaced by the new one. Updating costs are very low because holographic film memories can be inexpensively and accurately duplicated.

Updating costs can be further reduced of periodically adding "update priority strips" to the film memory. An identical short film strip with the updated data is added to each end of the film memory. The priority strip contains additional information, e.g., it adds additional customers to the list of bad credit risk accounts or removes previously recorded ones from the list if their credit status has improved. Electronic circuitry is provided as necessary to effect the override provided by the update priority strips. In this manner the memory can be kept current without requiring the re-record of the whole memory, the bulk of which ordinarily does not change over short time periods.

Aside from uses of the holographic data storage and retrieval system of the present invention for search and compare operations, as when making credit checks, the system is also adapted to operate in an address-retrieval mode. In such operation data is stored at a specific address on the film. Data is retrieved by advancing the film until the laser beam is aligned with the desired hologram for read out of data stored in that and/or in succeeding holograms. When operating in the address-retrieval mode, larger data blocks than simple low-level credit codes are read out. The output can be on a cathode ray tube (CRT), a line printer, a teletype or a digital alphanumeric display. Example applications include telephone number look-up for information operators, airline schedule and rate data for ticket agents, or real estate listings for realtors.

In yet another application of the present invention the memory unit can be operated in an address-retrieval mode in which the hologram at a particular address is advanced to the read station. In such an application the hologram can have pictorial information instead of binary codes, which can then be displayed on a screen for viewing.

In a further operating mode the holographic data storage and retrieval system of the invention is interfaced with an on-line computer or other peripheral device. In that mode the film stores program and machine instructions which are serially read into the computer at high speed. The system input can be a keyboard which provides for entry of an address for the block data in the memory (similar to the address-retrieval operating modes described above) but typically comes from the computer. Thus, the holographic data storage-retrieval device of the invention can operate as an on-line peripheral device with both input and output interfacing to a computer. Reloadable process control memories, microprogramming, table look-up, and subroutine library storage represent applications for operating in this mode.

BRIEF DESCRIPTION OF THE DRAWINGS

FIG. 1 is a schematic representation of the holographic data storage and read-out system of the present application in which binary holographic spot patterns are recorded and sensed;

FIG. 2 is a plan view of a holographic data storage and retrieval apparatus constructed in accordance with the invention and particularly illustrates the portion of the apparatus reconstructing images from the holograph, the keyboard input and data read-out and, schematically, the supporting electronic logic;

FIG. 3 is a fragmentary side elevational view of the apparatus illustrated in FIG. 2 and shows an optical bench, the laser and the supporting optomechanical components for effecting data retrieval;

FIG. 4 is a bottom view of the apparatus illustrated in FIG. 2;

FIG. 5 is a view similar to FIG. 1 but schematically illustrates another manner in which holographic data stored on the film in parallel rows can be read out in accordance with the invention;

FIG. 6 is a schematic block diagram illustrating logic similar to the logic illustrated in FIG. 2 but for use of the computer in an address-retrieval operating mode;

FIG. 7 is a view similar to FIG. 6 but illustrates operation of the data storage and retrieval system of the invention in a block transfer mode in conjunction with an interfaced computer; and FIG. 8 is a view similar to FIG. 1 illustrating another construction of the holographic data storage and retrieval system in which holograms are recorded on an endless loop of film.

DESCRIPTION OF THE PREFERRED EMBODIMENTS

Referring to FIG. 1, the holographic data storage and retrieval system of the invention broadly comprises a holographic memory in the form of an elongate film strip 10, a light source such as a laser 12, means 14 for moving the film longitudinally past a light beam 16 from the laser and a detector 18 upon which images are reconstructed from holograms 20 on the film. The holograms are recorded on the film in a plurality of longitudinal, parallel hologram rows 22. Means such as a reflector arrangement 24 is also provided for moving laser beam 16 perpendicular to the direction of film movement to any one of the hologram rows.

The holograms on the film are of a size of no greater than 0.020 inch square and they are arranged side-by-side so that edges of adjacent holograms in a row touch to fully utilize the available film area. With 0.020 inch square holograms, 40 hologram rows 22 can be recorded on standard 35 millimeter film with a spacing between adjacent rows of 0.008 inch. The laser beam is focused on the film with a lens (not shown in FIG. 1) and has a diameter about equal to the square size of the holograms, or about 0.020 inch. As the film moves past the beam, the beam reconstructs an image from each hologram on the detector. In instances where the hologram comprises a spot pattern the beam reconstructs a corresponding spot pattern on the detector which is sensed by photosensitive cells 26 of the detector. The cells, arranged in columns and rows, are electronically scanned to obtain a digital electronic output signal responsive to the particular spot pattern displayed on the detector.

Holograms 20 are of the Fourier transform type to gain the advantages of shift invariance so that the spot pattern is imaged on the detector irrespective of whether or not the laser and/or the film are precisely aligned and positioned so long as the laser strikes any part of the hologram.

The division of film 10 in 40 rows substantially reduces holograph scanning time during operation of the system in its search mode, as contrasted from operation in its address mode, if it is known in which column a given hologram would occur. In instances in which the holograms are binary spot patterns of reference numbers, say credit card numbers of credit customers of an oil company, this is done by dividing all credit customers of such company, or all members of a group, into a number of classes which equals the number of hologram rows 22 on film 10. In a 40 row film system, therefore, the customers are divided into 40 classes. To assure an equal distribution of the customers into the classes they are randomly but in a determinable manner assigned to the classes. Preferably, a mathematical algorithm is formed from predetermined digits of the reference numbers. For example, the first three digits of the card number are used to randomly assign each reference number to a predetermined class, and therefore hologram row, out of a total of 40 possible classes in the group. With this algorithm the hologram row in which the reference number of any customer, that is in which the number of any member of the group would be recorded can be determined. Consequently, only one hologram row needs to be scanned instead of requiring the scanning of all holograms recorded on the film. In a 40 row system the scanning time is thus reduced by a factor of 40:1. This results in correspondingly large time savings in completing a search and compare operation.

To further decrease the average time within which a search and compare operation can be completed it is preferred that the holograms in each row be recorded in an ascending or descending order of the corresponding reference numbers. The supporting electronic logic is set up so that it constantly compares the scan signals from the detector with the reference signal to find a match. The logic is set up to signal the absence of the match, and therefore that the customer does not belong to the subgroup, as soon as the scan signal from the detector corresponds to a number which is higher or lower, respectively, than the reference number. In this manner the average read-out time in a search and compare mode operation is again half over what it would be were the holographs randomly distributed in each film row so that the row must be completely scanned unless a match is found.

The holograms actually recorded on the film are holograms of the binary spot pattern of those credit customers that have impaired or forfeited their credit with the creditor. These customers form a subgroup of the group of all credit card holders. Included in such subgroup can, of course, also be members who for one reason or another are to obtain preferential treatment or who otherwise deviate from the norm and require the attention of service personnel.

Referring to FIGS. 1–4, the construction of a holographic data storage and retrieval device in accordance with the invention is described in greater detail. A support structure 28 has a generally rectangular outline and a length so that a person can grasp both ends for convenient portability of the device. The support structure includes a plate 30 defining an optical bench and a base 32. The two are interconnected by upright walls 34. A light source such as a laser 36 is mounted to the underside of the optical bench. The laser is aligned with the longitudinal axis of the bench and emits a light beam 37 in the righthand direction, as viewed in FIG. 3. The laser is preferably a helium-neon gas laser about 11 inches in length and ½ inches in diameter. Other readily available lasers can be substituted.

An adjustable mirror system 38 is disposed on the righthand side (as viewed in FIG. 3) of the laser and comprises a longitudinally movable mirror 40 and a stationary mirror 42. The movable mirror is mounted to the underside of the optical bench and is guided parallel to the laser beam on two horizontal, spaced apart guide bars 44 mounted to downwardly depending brackets 46. A lead screw 48 is threaded through the body of the mirror. A reversible motor 50 mounted to base 32 is coupled to the lead screw by a chain drive 52 or the like.

Stationary mirror 42 is mounted to the upperside of the optical bench with an upright support plate 54 and a bracket 56. The stationary mirror is disposed over an elongate aperture 58 in optical bench 30 which in turn is disposed over and in alignment with the travel path of movable mirror 40.

Both mirrors have reflecting surfaces 60, 62 which are inclined with respect to the axis of the laser beam 45°. The reflecting surface 60 of the movable mirror intercepts the laser beam and directs it perpendicularly upwardly past bench aperture 58 to the reflecting surface 62 of the stationary mirror. There, the light beam is again perpendicularly deflected into a direction parallel and opposite to the direction of the laser beam emitted by laser 36, that is, parallel to the optical bench. By moving mirror 40 to the left or right, as viewed in FIG. 3, the upwardly directed portion of the laser beam strikes reflecting surface 62 of the stationary mirror at the higher or lower point. The distance between the laser beam deflected by the stationary mirror and the optical bench is thus correspondingly increased or decreased. At all times, however, the reflected laser beam is parallel to the optical bench and parallel to the light beam from the laser.

A generally rectangular receptacle 64 is mounted to the upperside of the optical bench 30 and includes a vertical slot 66 aligned with bench aperture 58. A film cartridge 68 is removably placed into the receptacle. A pair of film spools 70 are inside the cartridge and store a length of 35 millimeter film 72. A center portion 74 of the cartridge has a reduced thickness and includes a spring biased contact plate 76. The contact plate gently biases film between the spools against a vertical film positioning wall 78 of the cartridge which is perpendicular to the laser beam reflected by stationary mirror 42. The contact plate and the cartridge walls include vertical slits 80, 82, respectively, that are aligned with receptacle slot 66 and which have a sufficient vertical extent so that the high and low laser beam reflected by the stationary mirror can pass through them.

A reversible cartridge drive 84 rotates the film spools in one or the other direction for winding the length of the film between them. The film drive comprises a reversible motor 86 mounted to base 32, a horizontal transmission shaft 88 driven by the motor via bevel gears 90 and a pair of spaced apart, upright drive shafts 92. The drive shafts extend through the optical bench and receptacle 64 for engaging and rotating the spools. Another set of bevel gears 94 on the transmission shafts and the driven shafts rotates the driven shafts. Suitable coupling means (not separately shown) is provided for connecting the upper drive shaft ends to the film spool 70 in cartridge 68. A suitable chain drive (not shown in the drawings) can be substituted for the illustrated bevel gear drive.

Optically, laser beam 37 emitted by laser 36 is focused in the plane of film 72 positioned against vertical cartridge wall 78 by a lens 96 which has a focal length equal to the distance between the lens and the detector. At the film the laser beam has a cross section of about ½ millimeter (about 0.020 inch) and great intensity. The vertical adjustability of the laser beam permits the illumination of every part of film 72 over its usable width with a parallel light beam for uniform reconstruction of the images from the holograms recorded on the film on an optical detector 98 mounted to the left of film cartridge 68, as viewed in FIG. 3. The detector is angularly offset from the incoming laser beam for off-axis reconstruction of images from off-axis holograms on the film. The precise angular offset is determined by the manner in which the holograms were recorded.

A lens 100 images the off-axis portion of the laser beam on the detector. If the holograms are of the Fourier type, the lens performs an inverse Fourier transform of the off-axis light signal defracted from the hologram to focus the signal on the optical detector 98 at the back focal plane of the lens. The hologram on film 72 will usually be the hologram of a binary spot pattern which is focused on the detector. The detector comprises an array of photoelectric cells or sensors 102 arranged in columns 104 and rows 106. The spot pattern is accurately aligned with the cells of the detector even if there exists some misalignment in the positioning of the film and/or the laser beam because of the "shift invariance" so that the spot pattern remains fixed on the photoelectric cell array independently of the beam and film position.

The number of photoelectric cell rows and columns is determined by the particular application of the device. For 12 digit reference numbers as commonly used in credit card systems, there are 4 columns and 14 rows, 12 of which are for the decimal credit card digits and 2 for additional information. This 56 element light sensitive detector converts 56-bit spot patterns reconstructed from holograms on the film into 56 digital electronic signals. Each detector in the array operates independently of the others and produces an electric current proportional to the intensity of the incident light. If a light spot is focused on a detector a relatively large current is generated, whereas in the absence of a light spot, no current is generated. The current threshold is established about midway between the high and low current levels and if the current exceeds the threshold it is interpreted as logic "1" whereas current below the threshold is interpreted as logic "0". A light spot on a cell, therefore, represents a binary "1" and the absence of a spot represents a binary "0".

The detectors are preferably spaced 0.100 inch apart and are about 0.040 inch in diameter. As the film is driven past the laser beam each hologram projects its 56 bit spot pattern on the array. It is preferred to maintain each spot pattern for about 500 microseconds. For 0.020 inch holograms this results in a film speed of about 40 inch per second.

During the 500 microsecond time interval one row is scanned every 10 microseconds to produce four current signals from each row which represent a decimal digit corresponding to a decimal digit of the reference member.

Referring now particularly to FIG. 2, the electrical signals obtained from scanning optical detector 98 are compared with the reference signal. For use in credit card verification systems this reference signal is normally a binary code of the reference number. The number is punched into a keyboard 108 mounted to a housing 110 that is separate and independent of support structure 28. Cable means 112 electrically connect the keyboard with electronic logic 114 mounted to support structure 28.

The punched-in reference signal is stored in a comparing circuit 116. Any given binary spot pattern of a 12 digit reference number generated on optical detector 98 is sensed by scanning the first 12 rows to generate twelve four-current signals, one for each detector row. Each row signal is compared with the corresponding digit of the reference number punched into keyboard and stored in comparing circuit 116. This four-bit parallel comparison is repeated twelve times so that all 12 digits of the identification number are compared with the digits punched into the keyboard. This takes about 120 microseconds. If no match is detected the electronic logic waits for the next hologram which arrives in about 380 microseconds and the process is repeated.

To assure synchronization between the electron scan of the detector rows and the image reproduction on the detector a scanning activating circuit 118 is provided. The activating circuit responds to the presence of a light spot on one of two specially assigned synch-detector photoelectric cells, say the two right hand cells 103 of the first row. When light is detected above a preset threshold level by one of the synch-detectors the electronic scan of the rows is initiated. Since the light spots on the synch-detectors appear at the same rate and time as the remaining data light spots it is sufficient to detect the presence of the synch spots to initiate the scanning or reading of the data. In this manner the scan is timely initiated irrespective of the film speed and difficult synchronization problems between the film speed and the electron scan of the detector are avoided.

Rows 13 and 14 serve as information storage rows and they are scanned and read out to a grading circuit 122 to provide certain information about the reference number to the operator of the keyboard. For credit card verification this information usually comprises maximum credit levels, an indication of an apparent unauthorized use of the card or the like. If the comparing circuit 116 detects a match between the keyed in reference number and the electronic scan signal from detector 98 a gate, which was preselected from the information retrieved from scanning detector rows 13 and 14, is opened.

Housing 110 includes an information panel 124 to indicate to the operator the results of the search of film memory 72 for match with a customer's credit or identification number. If no match is found a green light 126, or a chosen symbol or legend, on panel 124 is illuminated. The green light is illuminated with a signal received from comparing circuit 116 in response to failure to detect a match. If a match is found a red light 128 on the panel is illuminated. The red light as illuminated by a signal from grading circuit 122 in response to finding a match. In addition, grading circuit 122 generates a grading signal for the illumination of one of the plurality of indicator lights 130 through the above-described opening of the corresponding gate. The indicator light are coded to inform the operator of maximum credit levels, a suspicion of fraud and/or use of a lost or stolen card, etc. If preferential treatment is to be accorded to a customer a corresponding indicator light such as a green star 132 is illuminated in lieu of red light 128 and one of the grade indicators 130.

The signal indicating to the operator the result of his search is flashed to him as soon as a match is found and rows 13 and 14 have been scanned or no match has been found. To speed up the process the holograms are recorded on the film in ascending order of their corresponding numbers. The comparing circuit 116 generates a no-match signal to illuminate green light 126 as soon as the search number is lower or higher than the numbers on the film being searched.

As already discussed above, the holograms on the film are recorded in 40 parallel rows with each number in the credit card verification system or the like being assigned to one of the 40 rows. Row selection is random with an algorithm formed from the first three digits of a customer's identification or credit number. The first three digits keyed into the keyboard 108 are transmitted to a channel selecting circuit 134 which immediately energizes motor 50 to transport movable mirror 40 to the position in which the laser beam strikes the desired row on the film. While the movable mirror is positioned the remainder of the identification or credit number is punched into the keyboard and as soon as the full number has been punched and the mirror is properly positioned, a film drive and laser activating circuit 136 energizes laser 36 and electric motor 86 to advance film in one or the other direction from one film spool 70 to the other. All holographs in a given film row are thereby illuminated by the laser beam and corresponding images are formed on detector 98. Comparing circuit 116 thus can compare the keyed in reference number with each reference number holographically stored on the hologram row of film 72 in which the customer's credit number would be recorded if it were bad or deserved special attention. Failure to find a match means that the customer's number has not been recorded and that he can be given the customary service and credit. A match, on the other hand, gives the keyboard operator instruction on how to proceed. Fraud, theft or credit misuse, or unauthorized entry to restricted areas and the like is thereby made difficult or impossible.

The checking operation takes so little time so as to be neither burdensome on the operator nor irritating to the customer. For storing up to 250,000 12-digit numbers (12 million bits) in 40 hologram rows on the film and with a film speed of forty inches per second for a 500 microsecond hologram reconstruction on the detector the average inquiry is completed ½ seconds after the number is punched into the keyboard. The maximum time interval between entering the number and a read out is about three seconds. In addition to the match the apparatus provides a multilevel response to inquire further into the credit status of a card holder and to thus provide the operator or sales person with precise and updated instructions on how to handle the account. Film cartridge 68 enables a quick replacement of the film memory with a new, updated memory. Cartridge replacement requires almost no time and skill and can be performed on the spot by sales personnel.

Referring to FIG. 6, the holographic data storage and retrieval device of the present invention can also be used to retrieve information from a certain address on the film as compared to the above-described search and compare mode operation. In such an instance, the information is recorded on the film at a known address and the operator punches such address into keyboard 138. This activates the film transport and laser in the above-described manner. The keyed in address also activates electron scan circuit 140 when the film arrives at the punched address. Information is then read off the hologram, sent to a decoder 142 and displayed visually as on a CRT screen 144 or printed out in any convenient manner. If desired, blocks of information can be read off holograms following the addressed hologram.

Referring to FIG. 7, the holographic data retrieval and storage device of the present invention can also be interfaced with an on-line computer 146 for the transfer of data blocks from the holographic memory to the computer. The device is addressed via a keyboard 148 or directly by the computer. The addressed hologram and succeeding holograms are scanned and decoded and serially read out at high speed to the computer.

Referring briefly to FIG. 5, another holographic data storage and retrieval system similar to the one shown in FIG. 1 employs a holographic film memory 150 which includes multiple, e.g., 40 rows 152 of holograms 154. A laser 156 directs light beam 158 to the film for reconstructing holograms on a detector 160. Vertical beam adjustment in the direction of arrow 162 is obtained from a hologram 164 mounted to a card such as a credit card 166.

To run a credit check the reference number is punched into the keyboard (not shown in FIG. 5) in the above-described manner. The light beam is vertically deflected to the proper hologram row by positioning the credit card 166 so that the laser directs beam 158 to card hologram 164. The hologram then deflects the light beam to the desired row. This eliminates the need for optomechanically deflecting the laser light beam. Data sensing, comparing and read-out is as described above.

Referring to FIG. 8 in yet another embodiment of the invention holographic film memory 168 comprises an endless loop of film 170 that is driven by motor 172. A laser 174 directs light via mirrors 176 from the inside of the loop through the film to a detector (not shown in FIG. 8). As before, the holograms are recorded in a plurality of longitudinally extending channels and the mirrors are selectively adjusted to direct the laser beam to the desired hologram row. In this embodiment the need for reversing the direction of film movement and for having an electronic logic which compares the binary reference number with the holograms in an ascending or descending order to take account of the reversal of the film movement is eliminated.

We claim:

1. A method for varifying the presence or absence of a unit identified by a unique spot pattern in a subset of a multiplicity of such units all of which belong to a still larger group of such units, the method comprising the steps of assigning each unit in the group to a predetermined unit class of a plurality of unit classes, providing a length of photosensitive film, recording a holograph of the spot pattern of each unit in the subject and in a given class in a longitudinal row over the length of the film so that the number of rows on the film correspond to the number of classes and each unit from a given class is recorded in the same row, moving the film longitudinally past a reading station, directing a single light beam perpendicularly to the film, deflecting the beam to the row to which the unit is assigned, and searching the reconstructed spot patterns as the film moves past the reading station at least until the unit is found.

2. A method according to claim 1 including the step of searching for the presence of several units in the subset, and including the step of sequentially deflecting the light beam to the hologram rows to which each of the several units is assigned.

3. A method according to claim 2 wherein the step of detecting comprises the step of providing an array of light detectors, imaging the holographic spot pattern on the array, sequentially generating a unique electronic reference signal for each of the several units, electronically scanning the detector array to form scan signals compatible with the reference signal and responsive to the imaged spot patterns, and comparing each reference signal with the corresponding scan signal to determine the presence or absence of a match between thee scan signal and the reference signal and a corresponding presence or absence of each of the several units in the subset.

4. A verification method to determine the identity of a person, a person's credit rating, security risk and the like of a given member of a group of members, each member being assigned a unique number, by identifying a given member as belonging to a class of members which have an abnormal condition ini their identity, credit rating, security risk and the like, the method comprising the steps of holographically recording the numbers of the members of the class on an elongate film strip in a plurality of parallel, longitudinally extending rows by assigning each number to and recording a corresponding holograph on a predetermined row on the film, moving the film parallel to the rows past a read station, providing a single laser beam and directing the laser beam to the read station perpendicular to the film, generating a first reference signal and deflecting the laser beam in response to the first signal to the row in which a given number would be recorded, generating a second signal responsive to the given number, sensing each image of the hologram as the film moves past the read station, transforming the sensed images into electronic signals compatible with the second signal, comparing the second signal and the electronic signals, and indicating to the operator whether or not the second and the electronic signals match to thereby indicate whether or not the person to which the given number is assigned belongs to the class of members.

5. A method according to claim 4 wherein the step of sensing the images comprises the steps of forming spot patterns from the holographs on a light sensitive detector sensing the presence or absence of a spot pattern on the detector, and in response to sensing the presence of such pattern initiating an electronic scan of the detectors to generate an electronic signal.

6. A method according to claim 4 wherein the step of generating the first signal comprises the step of providing a keyboard for generating electric pulses, and keying into the keyboard a portion of the number of the given number.

7. A method according to claim 6 and wherein the step of generating the second signal includes the step of keying into the keyboard a remainder of the number of the given member.

8. A method for verifying the presence or absence of a given member of a group in a subgroup to check the member's credit, identity, security risk, and the like, each member having a different assigned number, the method comprising the steps of randomly distributing all members to a predetermined member class of a plurality of such classes, recording on a film strip a longitudinal row of holograms for each member class by recording thereon a Fourier transform type hologram of a binary spot pattern for each member belonging to both the class and the subgroup so that the numbers of all members in the subgroup are recorded on the film, directing a laser beam perpendicularly to the film surface, generating a binary reference signal with a portion of the given member's number, directing the laser beam in response to the reference signal to the hologram row on the film which corresponds to the class to which the given member is assigned, passing the film past the beam to thereby generate a spot pattern from each holograph in the row, optically sensing the generated spot patterns, transforming the sensed patterns into digital sensed signals, generating a digital input signal with a remainder of the given member's number, comparing the sensed signal and the input signal, and indicating to the operator whether or not the sensed signal and the input signal match to thereby inform the operator whether or not the given member is in the subgroup of members.

9. A method according to claim 8 wherein each recorded hologram includes holographic spot patterns indicating ratings for the members of the subgroup, and including the steps of sensing additional generated spot patterns in response to a match between the sensed signal and the input signal, and signalling to the operator the thus retrieved rating.

10. A method according to claim 9 wherein the step of moving the film comprises the step of alternatingly moving the film in one and another direction during successive readings, wherein the holograms in each row are arranged in accordance with ascending numbers assigned to the members of a class, and wherein the step of comparing the sensed signal with the input signal comprises the step of searching the sensed signals generated from the reconstructed spot patterns in an ascending or descending order and signalling to the operator as soon as the electronic signal corresponds to a number which is greater than or smaller than, respectively, the number corresponding to the input signal that the given member's number does not match a hologram recorded on the film and that the given member does not belong to the subgroup.

11. A search and compare apparatus for credit verification, security checks and the like comprising: a support structure, means for moving a length of film longitudinally past a read station, a light source mounted to the support structure, an obliquely positioned, linearly movable reflector for directing a light beam from the source to the read station and for adjusting the position of the beam in a first direction while maintaining the beam parallel in all its operative positions, an array of light sensitive detectors on the side of the read station opposite from the laser, means for scanning the detector array to produce an output signal responsive to the illumination or lack of illumination of the detectors in the array, meansn for forming a reference signal, means for comparing the reference signal with the output signal to determine if the two match, and means for signalling if a match between the two signals is found, whereby film can be moved past the reading station for illumination by the beam and reconstructing images on the detector array from holograms recorded on the film so that the holograms on the film can be compared with the reference signal to search for a match.

12. Apparatus according to claim 11 wherein the reference signal is generated from a multidigit number, wherein the means for generating the reference signal comprises a keyboard, means for selecting at least one digit of the number entered in the keyboard and forming therewith a beam positioning signal, and means for moving the reflector in response to the beam positioning signal to a predetermined position to correspondingly position the beam for illuminating a predetermined portion of the film which has a lesser width than the film.

13. Apparatus according to claim 12 wherein the digit selecting means includes means for selecting at least the first digit of the number, and including means for activating the mirror moving means as soon as such digit has been entered in the keyboard so that the mirror is positioned while a remainder of the number is entered in the keyboard.

14. Apparatus according to claim 11 including means for activating the scanning means in response to the appearance of a light pattern on the detector array to thereby synchronize the scanning operation with the light pattern formation independently of the rate with which the light patterns are generated.

15. Apparatus according to claim 11 including a length of 35 millimeter film having recorded thereon a multiplicity of holograms arranged side-by-side and in adjacent parallel rows extending over at least a portion of the film length, a cartridge housing the film, and means for positioning the cartridge at the reading station, and wherein the cartridge includes aligned slits permitting the beam to illuminate the film as the film moves past the slits for forming images on the detector array.

16. A verification apparatus for identifying specific members of a group, each member of the group having assigned a unique multidigit number, the numbers of the specific members being recorded on a length of film in the form of holograms, the holographs being distributed in a predetermined manner in a plurality of longitudinally extending, parallel rows on the film, the apparatus comprising:
  a. plate means defining an optical bench,
  b. a laser mounted to one side of the bench,
  c. mirror means for reflecting a light beam from the laser to the other side of the bench and parallel to the other bench side,
  d. means for moving the laser beam on the other side towards and away from the side while maintaining the beam parallel in all its positions,
  e. means for positioning the film at a read station perpendicular to the beam,
  f. means for longitudinally moving the film past the read station so that the hologram of a film row are sequentially illuminated by the laser beam,
  g. detector means comprising an array of light sensitive elements arranged in a plurality of columns and a number of rows,
  h. lens means between the detector means and the read station for focusing on the detector means images generated by the beam from the holograms on the film,
  i. scanning means for scanning the detector means and forming a first signal,
  j. an input keyboard including means for generating a second signal and a third signal from a number assigned to any given group member,
  k. means for adjusting the mirror in response to the second signal to direct the laser beam to the hologram row in which the number of such member would be recorded,
  l. comparing means for matching the first signal and the third signal,
  m. means for indicating to an operator the presence or the absence of a signal match located by the comparing means, and
  n. means for indicating to the operator a relative rating of the member in response to a match located by the comparing means so that relative credit ratings, security risks and the like can be obtained for the given group member.

17. Apparatus according to claim 16 wherein the mirror means includes means for deflecting the beam 180°, wherein the laser is mounted parallel to the beam at the reading station, and wherein the plate includes an aperture for the passage of the beam from the one side of the bench to the other side.

18. Apparatus according to claim 17 including drive means mounted to the same side of the plate as the laser for alternatively rotating film spools in opposing direction for moving the film past the read station.

19. Apparatus according to claim 18 wherein the mirror means comprises a stationary mirror mounted on the other side of the bench in alignment with the aperture, a movable mirror mounted to the one side of the bench in alignment with the laser beam and the aperture, end means for linearly moving the movable mirror parallel to the laser beam emanating from the laser to thereby reposition the point at which the beam strikes the stationary mirror and change the distance between the other side of the bench and the laser beam at the read station while maintaining the laser beam parallel.

20. Apparatus according to claim 16 including a first housing for the keyboard and the indicating means, a second, separate housing for the remainder of the apparatus, and including means for the transmission of signals between the housings.

21. Apparatus according to claim 16 including a cartridge for the film, the cartridge defining an inner space and having spaced apart film spools in the space, wherein the film moving means includes film drive means on the other side of the bench for releasably engaging the spools and alternatingly rotating the spools in one or the other direction, and means for removably positioning the cartridge on the bench.

22. Apparatus according to claim 21 wherein the cartridge includes means for guiding the film past the read station and for maintaining the film perpendicular with respect to the beam, the cartridge further including first and second slits permitting unimpeaded passage of the beam through the cartridge.

23. In a verification system for determining whether any member of a large group of members belongs to a certain subgroup of members which is smaller than the group, each member in the group having assigned to him a unique multidigit number, the method forming a holographic record of the members of the subgroup comprising the steps of selecting a plurality of digits from each number and forming an algorithm from such digits to randomly assign any number in the system to one of a predetermined, limited number of member classes each of which is smaller than the subgroup, transforming each number of the members of a given class into a binary code and recording on the film a holograph of a spot pattern of the code for each such class member by arranging all holographs of the members of the given class side-by-side in a single longitudinal row extending over at least a portion of the film length, so that the finished recorded film has a plurality of hologram rows which equals the plurality of classes in the system.

24. A method according to claim 23 wherein the film comprises 35 millimeter film, wherein holographs recorded on the film have a size of no more than about 0.020 inch square, and wherein the subgroup is divided in forty classes and the holograms are recorded in forty transversely spaced, longitudinal rows on the film.

25. A method according to claim 24 including the step of arranging the numbers of the members of each class in their ascending order, and recording the respective holograms on the film row in a corresponding ascending order.

26. A method according to claim 24 including the step of arranging the holograms in each row edge to edge so that adjacent hologram edges touch.

27. A method according to claim 23 including the step of selecting the first three digits of the assigned number of each member of the subgroup for determining the class to which such number belongs and the row in which the corresponding hologram is to be recorded.

28. A method according to claim 23 wherein the step of recording a hologram comprises the step of recording a Fourier transform type hologram.

* * * * *